United States Patent [19]
Kuo et al.

[11] Patent Number: 5,563,098
[45] Date of Patent: Oct. 8, 1996

[54] BURIED CONTACT OXIDE ETCH WITH POLY MASK PROCEDURE

[75] Inventors: So-Wen Kuo, Taipei; Chih-Hao Chang, Hsin-Chu, both of Taiwan

[73] Assignee: Taiwan Semiconductor Manufacturing Company, Hsin-Chu, Taiwan

[21] Appl. No.: 419,048

[22] Filed: Apr. 10, 1995

[51] Int. Cl.$^6$ .................. H01L 21/283; H01L 21/302
[52] U.S. Cl. ..................... 437/191; 437/193; 437/195
[58] Field of Search ..................... 437/186, 191, 437/193, 195; 257/756; 756/653.1, 643.1

[56] References Cited

U.S. PATENT DOCUMENTS

| | | | |
|---|---|---|---|
| 4,950,620 | 8/1990 | Harrington, III | 437/60 |
| 5,147,499 | 9/1992 | Szwejkowski et al. | 156/643 |
| 5,201,993 | 4/1993 | Langley | 156/643 |
| 5,326,713 | 7/1994 | Lee | 437/41 |
| 5,410,174 | 4/1995 | Kalnitsky | 257/384 |

FOREIGN PATENT DOCUMENTS

| | | |
|---|---|---|
| 63-170922 | 7/1988 | Japan . |
| 2-112262 | 4/1990 | Japan . |

Primary Examiner—T. N. Quach
Attorney, Agent, or Firm—George O. Saile; Rosemary L. S. Pike

[57] ABSTRACT

A method of forming buried contact holes is described. A layer of silicon oxide is provided overlying a semiconductor substrate. A layer of polysilicon is deposited overlying the silicon oxide layer. The polysilicon layer is covered with a layer of photoresist which is exposed and developed to provide a photoresist mask. The polysilicon layer is etched away where it is not covered by the photoresist mask wherein a polymer buildup is formed on the sidewalls of the polysilicon layer. Ions are implanted into the silicon oxide layer not covered by the photoresist mask. The photoresist mask is removed whereby the polymer buildup is also removed. Thereafter, the silicon oxide layer not covered by the polysilicon layer is etched away to complete the formation of the buried contact hole with reduced polymer buildup in the fabrication of an integrated circuit.

20 Claims, 2 Drawing Sheets

BURIED CONTACT OXIDE ETCH WITH POLY MASK PROCEDURE

BACKGROUND OF THE INVENTION

1. Field of the invention

The invention relates to the fabrication of integrated circuit devices, and more particularly, to a method of forming a buried contact hole with reduced polymer deposition in the fabrication of integrated circuits.

2. Description of the Prior Art

In the typical buried contact etch process flow, the thin polysilicon layer is etched through, then the buried contact implant is made, followed by the buried contact etch, and photoresist stripping. In this conventional process flow, polymer deposits will build up in the buried contact hole during the buried contact etch. The polymer deposits come from the breakdown of the photoresist material during implantation. The presence of the polymer deposits on the sidewalls of the buried contact hole provide a masking effect so that the buried contact hole etch is not complete. This will effect the electrical parameters of the completed integrated circuit.

U.S. Pat. No. 5,147,499 to Szwejkowski et al describes a method of removing polymer deposits after poiysilicon etching by applying an aqueous hydroxide/peroxide solution. It is desirable to remove and/or prevent polymer buildup without additional process steps.

SUMMARY OF THE INVENTION

A principal object of the present invention is to provide an effective and very manufacturable method of removing polymer buildup in the formation of buried contact holes in the fabrication of integrated circuits.

Another object of the present invention is to provide a method of reducing polymer buildup in the formation of buried contact holes.

In accordance with the objects of this invention a new method of forming buried contact holes is achieved. A layer of silicon oxide is provided overlying a semiconductor substrate. A layer of polysilicon is deposited overlying the silicon oxide layer. The polysilicon layer is covered with a layer of photoresist which is exposed and developed to provide a photoresist mask. The polysilicon layer is etched away where it is not covered by the photoresist mask wherein a polymer buildup is formed on the sidewalls of the polysilicon layer. Ions are implanted into the silicon oxide layer not covered by the photoresist mask. The photoresist mask is removed, whereby the polymer buildup is also removed. Thereafter, the silicon oxide layer not covered by the polysilicon layer is etched away to complete the formation of the buried contact hole with reduced polymer buildup in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
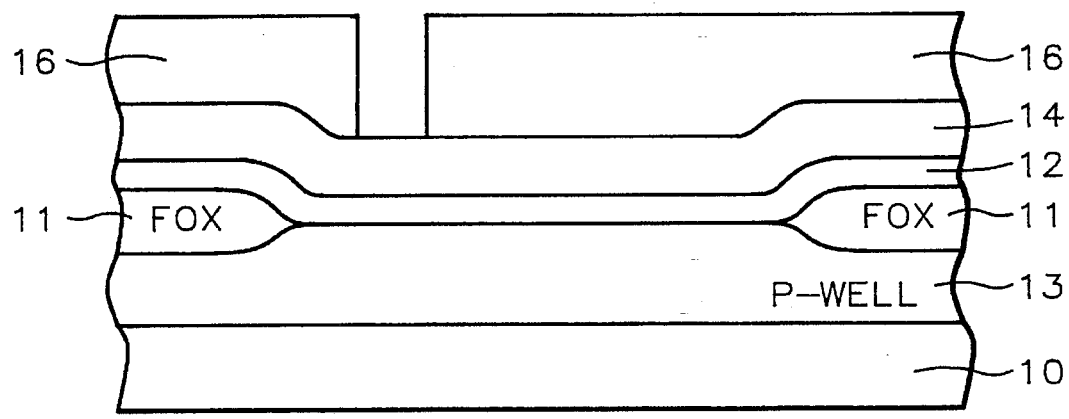
FIGS. 1 through 4 schematically illustrate in cross-sectional representation a preferred embodiment of the present invention.

Referring now more particularly to FIG. 1, there is shown a portion of a partially completed integrated circuit. There is shown a semiconductor substrate 10, preferably composed of silicon having a (100) crystallographic orientation. Field Oxide regions 11 are formed to isolation active area of the integrated circuit from one another. A P-well region 13 may be implanted as is conventional in the art. A layer of silicon oxide 12 is grown or deposited on the surface of the semiconductor substrate to a thickness of between about 125 to 140 Angstroms.

The polysilicon layer 14 is blanket deposited to a thickness of between about 500 to 600 Angstroms. A layer of photoresist is coated over the polysilicon layer and patterned to form a photoresist mask 16.

Figure 2:
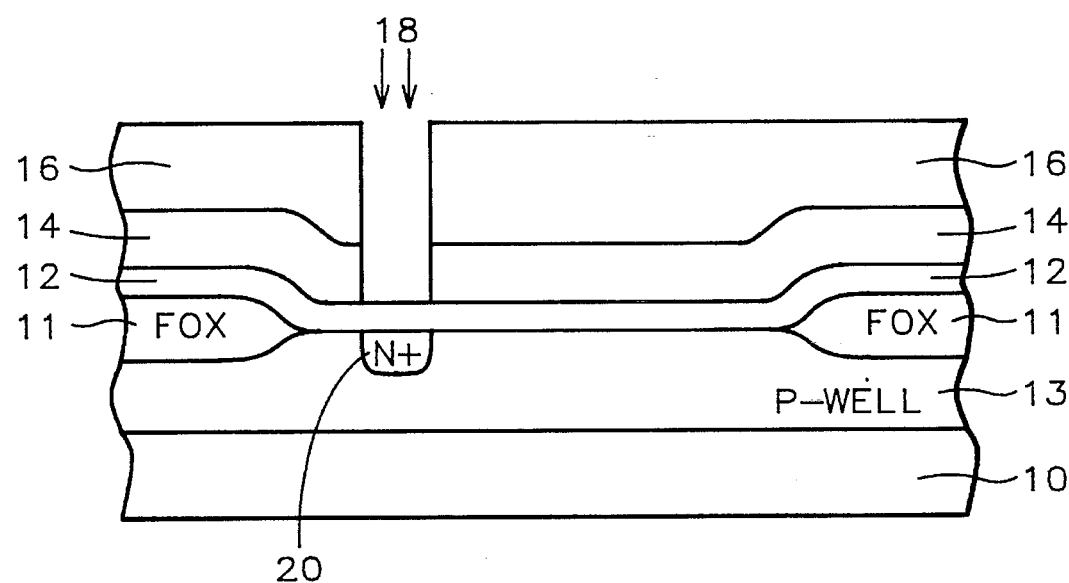

Now, the buried contact hole is to be formed. First, the polysilicon layer 14 is etched through using a dry etch, such as HBr or $Cl_2$ plasma. Next, as shown in FIG. 2, the buried contact implant 18 is made into the oxide layer 12 where it is not covered by the photoresist mask 16. This forms buried contact region 20. For ion implantation, boron ions are implanted to produce N+ regions. The preferred dosage is in the range of about 1E 13 atoms/$cm^3$. An energy of between about 135 to 165 KeV is used for implantation.

A polymer buildup forms on the sidewalls of the etched polysilicon layer during polysilicon etch and during the buried contact implant. The polymer buildup is composed of carbon, hydrogen, oxygen, and fluorine complexes.

Figure 3:
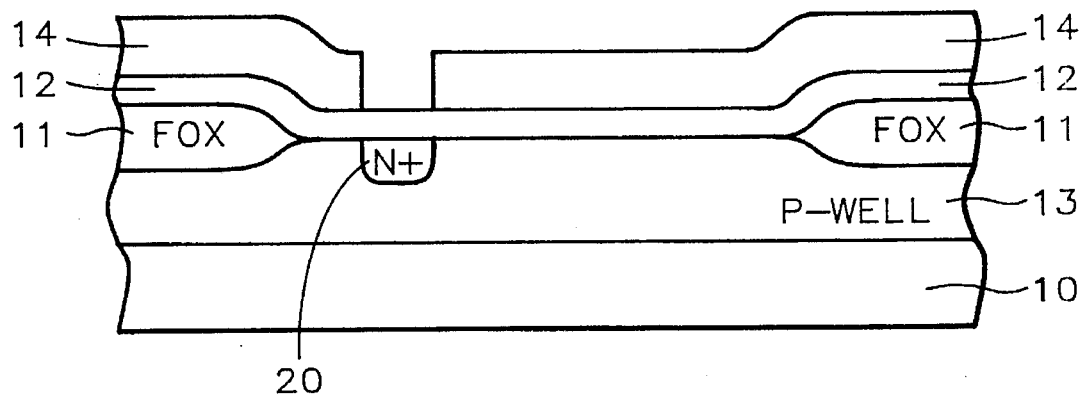

Up to this point, the process is conventional. However, while the conventional process calls for the buried contact etch followed by the photoresist strip, the process of the present invention calls for the photoresist strip to be done prior to the buried contact etch. The photoresist mask 16 is stripped by a dry oxygen plasma strip and a wet $H_2SO_4$ strip. The photoresist stripping removes the photoresist mask, as seen in FIG. 3. This stripping also breaks the chemical bonds of the polymer and removes the polymer buildup on the sidewalls of the polysilicon layer 14.

Figure 4:
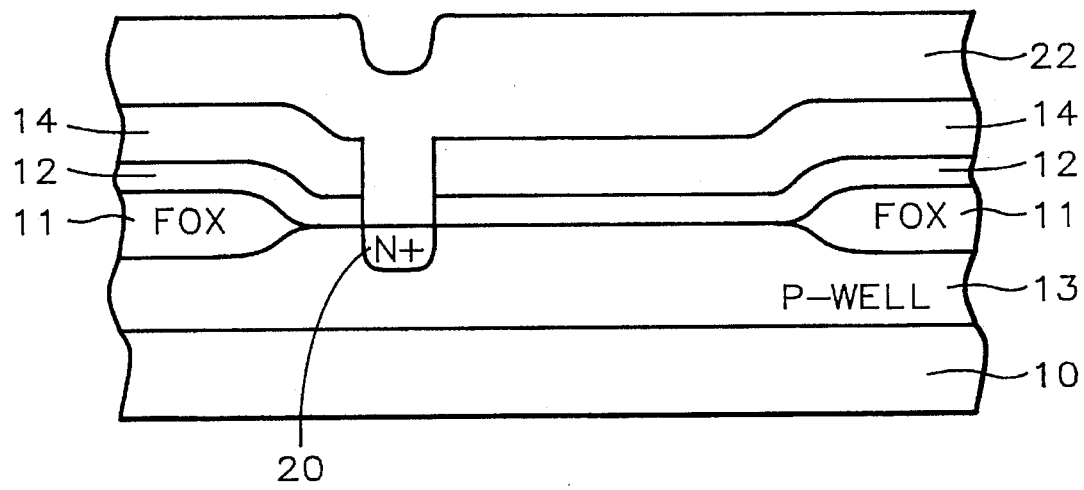

Next, as shown in FIG. 4, the silicon oxide layer 12 is etched away where it is not covered by the polysilicon layer using a plasma etch. A second polysilicon layer 22 is deposited to a thickness of between about 2700 to 3500 Angstroms over the surface of the substrate and within the buried contact hole to complete the formation of the buried contact in the fabrication of an integrated circuit.

While the invention has been particularly shown and described with reference to the preferred embodiments thereof, it will be understood by those skilled in the art that various changes in form and details may be made without departing from the spirit and scope of the invention.

What is claimed is:

1. A method of forming a buried contact hole with reduced polymer deposition in the fabrication of an integrated circuit comprising:

providing a layer of silicon oxide overlying a semiconductor substrate;

depositing a first layer of polysilicon overlying said silicon oxide layer;

covering said first polysilicon layer with a layer of photoresist and exposing and developing said photoresist layer to provide a photoresist mask;

etching away said first polysilicon layer where it is not covered by said photoresist mask wherein a polymer buildup is formed on the sidewalls of said first polysilicon layer;

implanting ions into said silicon oxide layer not covered by said photoresist mask wherein a further polymer buildup is formed on the sidewalls of said first polysilicon layer;

removing said photoresist mask whereby all of said polymer buildup is also removed;

thereafter etching away said silicon oxide layer not covered by said first polysilicon layer; and depositing a second polysilicon layer overlying said first polysilicon layer and within said buried contact hole to complete the formation of said buried contact hole with reduced polymer buildup in the fabrication of an integrated circuit.

2. A method according to claim 1 wherein said silicon oxide layer has a thickness of between about 125 to 140 Angstroms.

3. A method according to claim 1 wherein said first polysilicon layer has a thickness of between about 500 to 600 Angstroms.

4. A method according to claim 1 wherein said photoresist mask is removed by a dry strip and a wet strip.

5. A method according to claim 4 wherein said dry strip is an oxygen plasma strip.

6. A method according to claim 4 wherein said wet strip comprises dipping in a solution of $H_2SO_4$.

7. A method according to claim 1 wherein said second polysilicon layer has a thickness of between about 2700 to 3500 Angstroms.

8. A method of forming a buried contact hole with reduced polymer deposition in the fabrication of an integrated circuit comprising:

providing a layer of silicon oxide overlying a semiconductor substrate;

depositing a layer of polysilicon overlying said silicon oxide layer;

covering said polysilicon layer with a layer of photoresist and exposing and developing said photoresist layer to provide a photoresist mask;

etching away said polysilicon layer where it is not covered by said photoresist mask wherein a polymer buildup is formed on the sidewalls of said polysilicon layer;

implanting ions into said silicon oxide layer not covered by said photoresist mask wherein a further polymer buildup is formed on the sidewalls of said polysilicon layer;

removing said photoresist mask whereby all of said polymer buildup is also removed; and thereafter etching away said silicon oxide layer not covered by said polysilicon layer to complete the formation of said buried contact hole with reduced polymer buildup in the fabrication of an integrated circuit.

9. A method according to claim 8 wherein said silicon oxide layer has a thickness of between about 125 to 140 Angstroms.

10. A method according to claim 8 wherein said polysilicon layer has a thickness of between about 500 to 600 Angstroms.

11. A method according to claim 8 wherein said photoresist mask is removed by a dry strip and a wet strip.

12. A method according to claim 11 wherein said dry strip is an oxygen plasma strip.

13. A method according to claim 11 wherein said wet strip comprises dipping in a solution of $H_2SO_4$.

14. A method according to claim 8 further comprising depositing a second polysilicon layer to a thickness of between about 2700 to 3500 Angstroms overlying said polysilicon layer and within said buried contact hole.

15. A method of forming a buried contact hole with reduced polymer deposition in the fabrication of an integrated circuit comprising:

providing a layer of silicon oxide overlying a semiconductor substrate;

depositing a first layer of polysilicon overlying said silicon oxide layer;

covering said first polysilicon layer with a layer of photoresist and exposing and developing said photoresist layer to provide a photoresist mask;

etching away said first polysilicon layer where it is not covered by said photoresist mask wherein a polymer buildup is formed on the sidewalls of said first polysilicon layer;

implanting ions into said silicon oxide layer not covered by said photoresist mask wherein a further polymer buildup is formed on the sidewalls of said first polysilicon layer;

removing said photoresist mask with a dry strip and a wet strip whereby all of said polymer buildup is also removed;

thereafter etching away said silicon oxide layer not covered by said first polysilicon layer; and depositing a second polysilicon layer overlying said first polysilicon layer and within said buried contact hole to complete the formation of said buried contact hole with reduced polymer buildup in the fabrication of an integrated circuit.

16. A method according to claim 15 wherein said silicon oxide layer has a thickness of between about 125 to 140 Angstroms.

17. A method according to claim 15 wherein said first polysilicon layer has a thickness of between about 500 to 600 Angstroms.

18. A method according to claim 15 wherein said dry strip is an oxygen plasma strip.

19. A method according to claim 15 wherein said wet strip comprises dipping in a solution of $H_2SO_4$.

20. A method according to claim 15 wherein said second polysilicon layer has a thickness of between about 2700 to 3500 Angstroms.

\* \* \* \* \*